(12) United States Patent
Kwon

(10) Patent No.: US 11,127,658 B2
(45) Date of Patent: Sep. 21, 2021

(54) MANUFACTURING METHOD FOR REFLOWED SOLDER BALLS AND THEIR UNDER BUMP METALLURGY STRUCTURE

(71) Applicant: LBSEMICON CO., LTD, Gyeonggi-do (KR)

(72) Inventor: Jae Jin Kwon, Gyeonggi-do (KR)

(73) Assignee: LBSEMICON CO., LTD., Gyeonggi-Do (KR)

( * ) Notice: Subject to any disclaimer, the term of this patent is extended or adjusted under 35 U.S.C. 154(b) by 92 days.

(21) Appl. No.: 16/311,199

(22) PCT Filed: May 11, 2017

(86) PCT No.: PCT/KR2017/004854
§ 371 (c)(1),
(2) Date: Dec. 19, 2018

(87) PCT Pub. No.: WO2018/016723
PCT Pub. Date: Jan. 25, 2018

(65) Prior Publication Data
US 2019/0237392 A1 Aug. 1, 2019

(30) Foreign Application Priority Data
Jul. 18, 2016 (KR) .................. 10-2016-0091017

(51) Int. Cl.
*H01L 23/488* (2006.01)
*H01L 23/00* (2006.01)

(52) U.S. Cl.
CPC ............ *H01L 23/488* (2013.01); *H01L 23/00* (2013.01); *H01L 24/03* (2013.01); *H01L 24/05* (2013.01); *H01L 24/11* (2013.01); *H01L 24/13* (2013.01); *H01L 24/81* (2013.01); *H01L 2224/0401* (2013.01); *H01L 2224/05027* (2013.01); *H01L 2224/05082* (2013.01); *H01L 2224/05147* (2013.01); *H01L 2224/05155* (2013.01); *H01L 2224/05644* (2013.01); *H01L 2224/05647* (2013.01); *H01L 2224/11* (2013.01); *H01L 2224/1132* (2013.01); *H01L 2224/11312* (2013.01); *H01L 2224/11462* (2013.01); *H01L 2224/11849* (2013.01); *H01L 2224/13116* (2013.01); *H01L 2224/13139* (2013.01);
(Continued)

(58) Field of Classification Search
CPC .................................................... H01L 23/488
USPC ............................................................ 438/613
See application file for complete search history.

(56) References Cited

U.S. PATENT DOCUMENTS

| 2004/0217482 A1 | 11/2004 | Wang et al. |
| 2011/0062580 A1 | 3/2011 | Liu et al. |
| 2018/0269124 A1* | 9/2018 | Liu ................ H01L 24/19 |

FOREIGN PATENT DOCUMENTS

| JP | 2009302340 A | 12/2009 |
| JP | 2014044986 A | 3/2014 |
(Continued)

*Primary Examiner* — Ajay Arora
(74) *Attorney, Agent, or Firm* — Stuart H. Mayer; Mayer & Williams PC

(57) ABSTRACT

Provided is a method of manufacturing a semiconductor package, the method including a first step for forming a primary solder ball on an under bump metallurgy (UBM) structure, and a second step for forming a secondary solder ball on an upper surface of the UBM structure by performing a reflow process on the primary solder ball while a side wall of the UBM structure is exposed.

8 Claims, 4 Drawing Sheets

(52) U.S. Cl.
CPC ............... *H01L 2224/13144* (2013.01); *H01L 2224/13147* (2013.01)

(56) References Cited

FOREIGN PATENT DOCUMENTS

| KR | 1020020061528 | 7/2002 |
|----|---------------|--------|
| KR | 1020030066919 | 8/2003 |
| KR | 1010372870000 | 5/2011 |

* cited by examiner

MANUFACTURING METHOD FOR REFLOWED SOLDER BALLS AND THEIR UNDER BUMP METALLURGY STRUCTURE

TECHNICAL FIELD

The present invention relates to a wiring structure of an electronic device and a method of manufacturing the same, and more particularly, to a semiconductor package and a method of manufacturing the same.

BACKGROUND ART

In general, flip chip refers to a packaging technology capable of directly mounting an electrical apparatus or a semiconductor device face-down on a substrate or a board. An under bump metallurgy (UBM) structure used in the package technology is a metal structure provided between a solder ball and an electrode of a semiconductor chip or device. The UBM structure needs not to be oxidized in a subsequent process to achieve a low electrical resistance.

Related technology includes Korean Application Publication 2003-0066919 published on Aug. 14, 2003 and entitled "STRUCTURE AND METHOD FOR MANUFACTURING SOLDER BUMP OF FLIP CHIP PACKAGE").

DETAILED DESCRIPTION OF THE INVENTION

Technical Problem

The present invention provides a semiconductor package capable of preventing deterioration of electrical characteristics thereof due to oxidation of an under bump metallurgy (UBM) structure, and a method of manufacturing the same. However, the scope of the present invention is not limited thereto.

Technical Solution

According to an aspect of the present invention, there is provided a method of manufacturing a semiconductor package, the method including a first step for forming a primary solder ball on an under bump metallurgy (UBM) structure, and a second step for forming a secondary solder ball on an upper surface of the UBM structure by performing a reflow process on the primary solder ball while a side wall of the UBM structure is exposed.

In the first step, a thickness of the UBM structure may be greater than a thickness of an intermetallic compound formed at an interface of the solder ball and the UBM structure.

The second step may include a step for melting the primary solder ball to cover the side wall of the UBM structure and then cooling and contracting the primary solder ball to form an antioxidant layer on the side wall of the UBM structure and form the secondary solder ball on the upper surface of the UBM structure.

The second step may include a step for melting the primary solder ball to cover the side wall of the UBM structure and then cooling and contracting the primary solder ball to form an antioxidant layer on the side wall of the UBM structure and form the secondary solder ball not on the side wall of the UBM structure but on only the upper surface of the UBM structure.

The antioxidant layer may include a tin (Sn) component of the solder ball, and the UBM structure may be configured as a copper (Cu) layer.

The antioxidant layer may include a tin (Sn) component of the solder ball, and the UBM structure may include a structure in which a copper (Cu) layer, a nickel (Ni) layer, and a gold (Au) layer are sequentially stacked on one another, or a structure in which a Cu layer and a Ni layer are sequentially stacked on one another.

According to another aspect of the present invention, there is provided a semiconductor package including an under bump metallurgy (UBM) structure having a side wall surface-processed by a reflow soldering process, and a solder ball formed on an upper surface of the UBM structure.

A thickness of the UBM structure may be greater than a thickness of an intermetallic compound formed at an interface of the solder ball and the UBM structure.

The thickness of the UBM structure may be 20 μm to 50 μm.

Advantageous Effects

As described above, according to an embodiment of the present invention, a semiconductor package capable of preventing deterioration of electrical characteristics thereof due to oxidation of an under bump metallurgy (UBM) structure may be implemented. However, the scope of the present invention is not limited to the above-described effect.

MODE OF THE INVENTION

Figure 1:
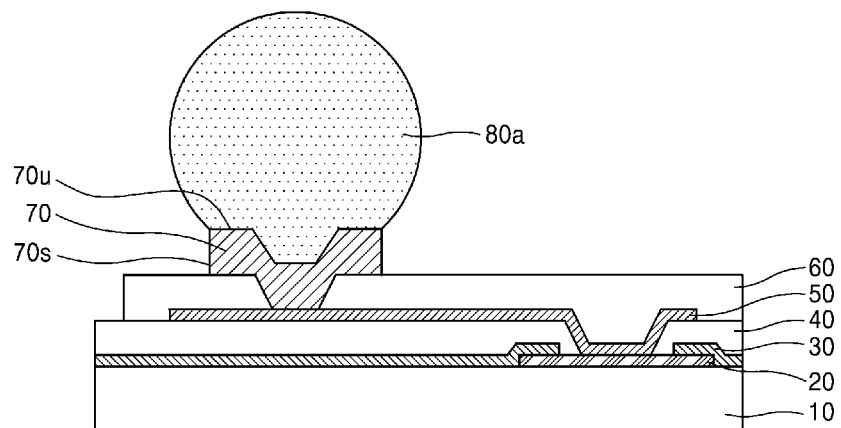
FIGS. 1, 3, 4, 5, and 6 are cross-sectional views for sequentially describing the steps of a method of manufacturing a semiconductor package, according to an embodiment of the present invention.

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

Figure 5:
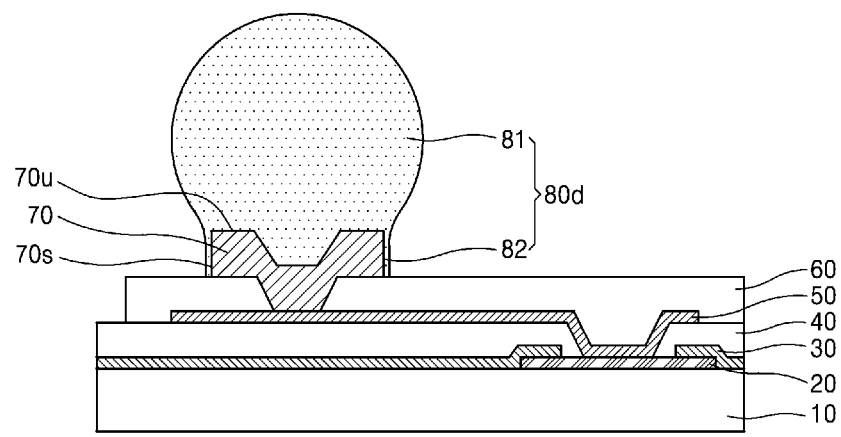
Figure 6:
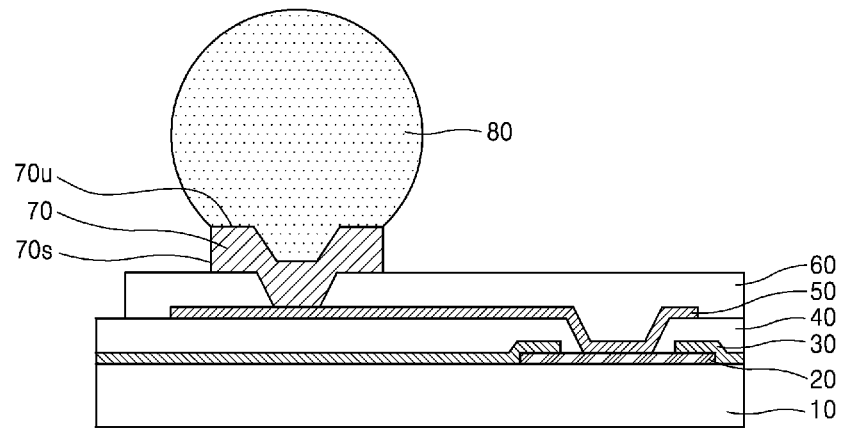
Figure 7:
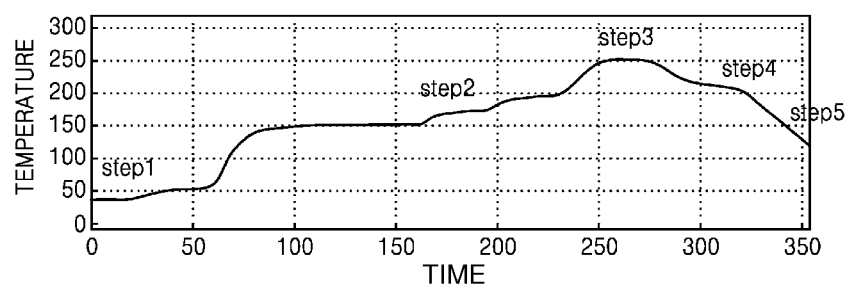
FIG. 7 is a graph showing a temperature profile of a reflow process used in the method of manufacturing a semiconductor package, according to an embodiment of the present invention.

FIGS. 1, 3, 4, 5, and 6 are cross-sectional views for sequentially describing the steps of a method of manufacturing a semiconductor package, according to an embodiment of the present invention, and FIG. 7 is a graph showing a temperature profile of a reflow process used in the method of manufacturing a semiconductor package, according to an embodiment of the present invention.

Referring to FIG. 1, a semiconductor chip or device including a conductive electrode pad 20 on a substrate 10 is initially prepared. The substrate 10 may include, for example, a wafer containing silicon (Si) or a substrate containing polymer and ceramic including glass. The conductive electrode pad 20 may be formed by coating and patterning metal on the substrate 10. In this case, the metal may include aluminum (Al) or tungsten (W). The conductive electrode pad 20 may be electrically connected to a rewiring pattern 50 formed to efficiently establish an electrical connection with an external circuit to be coupled onto the semiconductor device. The rewiring pattern 50 may be electrically connected to an under bump metallurgy (UBM) structure 70 formed on the rewiring pattern 50. To prevent unnecessary electrical shorts and physical or chemical damages due to an external factor, a first passivation pattern 40 and a second passivation pattern 60 may be formed between the conductive electrode pad 20 and the rewiring pattern 50 and between the rewiring pattern 50 and the UBM structure 70.

The UBM structure 70 may serve as a wetting layer for good adhesion of solder thereto in a subsequent process, and also serve as a diffusion barrier to prevent permeation of a solder component into the semiconductor chip. The UBM structure 70 provided between solder and the semiconductor device needs to have a low electrical resistance.

The UBM structure 70 may have various configurations and may include, for example, a structure in which a copper (Cu) layer, a nickel (Ni) layer, and a gold (Au) layer are sequentially stacked on one another, or a structure in which a Cu layer and a Ni layer are sequentially stacked on one another. As another example, the UBM structure 70 may include a structure configured as a Cu layer. Alternatively, the UBM structure 70 may include a Cr/Cr—Cu/Cu structure, a TiW/Cu structure, or an Al/NiV/Cu structure.

A primary solder ball 80a may be formed on the UBM structure 70. For example, the primary solder ball 80a may be formed on at least an upper surface 70u of the UBM structure 70 and, in this case, at least a part of a side wall 70s of the UBM structure 70 may be exposed. The primary solder ball 80a is an initial element to be implemented as a final solder ball 80 through a subsequent reflow process.

The final solder ball 80 may be understood as a sort of a bump. The bump may serve to increase an electrode height to facilitate implementation of a flip chip and also serve to replace an electrode material with a material easily connectable to an external electrode. In terms of a bump shape, a solder bump may be formed in, for example, a ball shape due to a surface tension effect after a reflow process. A material of the primary solder ball 80a may include CuSn or include AuSn, PbSn, $PbSn_5$, AgSn, or the like. The primary solder ball 80a may be formed by mounting a solder ball by using a nozzle, or be formed using an electroplating method, a screen printing method, a Super-Juffit method, or the like.

Figure 3:
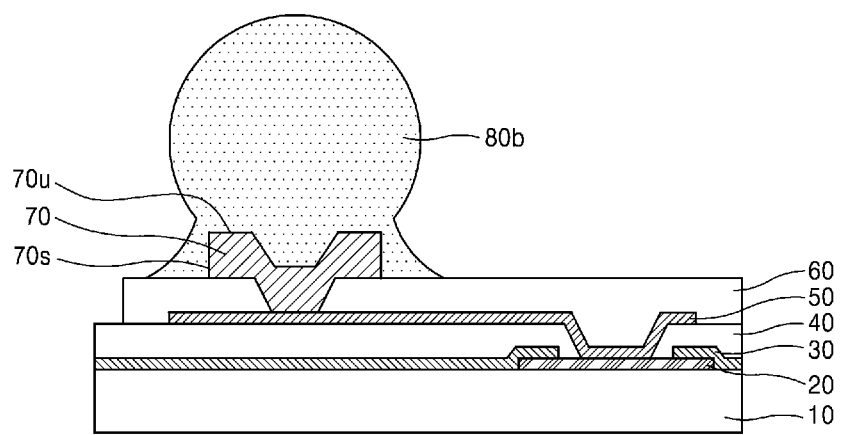
Figure 4:
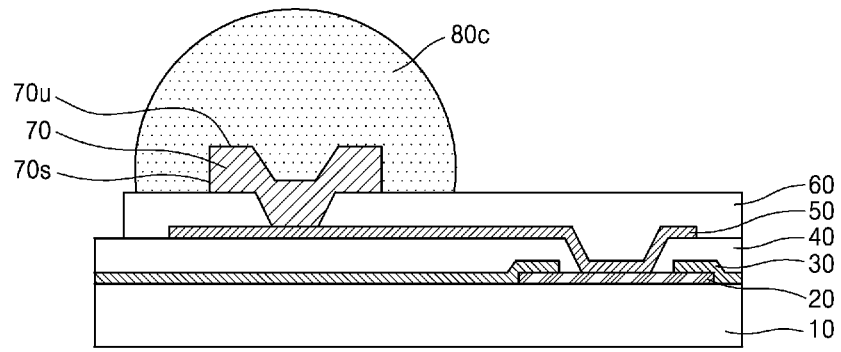

Referring to FIGS. 3 and 4, a reflow process is performed on the primary solder ball 80a while the side wall 70s of the UBM structure 70 is exposed. In this case, the primary solder ball 80a is melted or softened to entirely cover the side wall 70s of the UBM structure 70. As a temperature of the reflow process increases, a solder ball 80b having a concave part gradually changes into a hemispherical solder ball 80c due to the UBM structure 70.

Referring to FIG. 5, as the temperature of the reflow process decreases, a molten solder ball 80d is cooled and contracted. Particularly, a part of the solder ball 80d adjacent to the side wall 70s of the UBM structure 70 may have a very small thickness.

Referring to FIG. 6, the molten solder ball 80d is continuously cooled and contracted to form a secondary solder ball 80 on the upper surface 70u of the UBM structure 70.

In this case, a tin (Sn) component of the secondary solder ball 80 may be coated on the side wall 70s of the UBM structure 70 to prevent oxidation of the UBM structure 70. Ultimately, an antioxidant layer may be formed on the side wall 70s of the UBM structure 70 and the secondary solder ball 80 may be formed on the upper surface 70u of the UBM structure 70.

More specifically, the antioxidant layer may be formed the side wall 70s of the UBM structure 70 and the secondary solder ball 80 may be formed not on the side wall 70s of the UBM structure 70 but on only the upper surface 70u of the UBM structure 70.

Herein, the antioxidant layer serves to at least reduce or prevent oxidation of the side wall 70s of the UBM structure 70. When energy-dispersive x-ray (EDX) composition analysis is performed on the conductive electrode pad 20 having the above-described configuration, a layer containing Sn is observed on the side wall 70s of the UBM structure 70.

Figure 2:
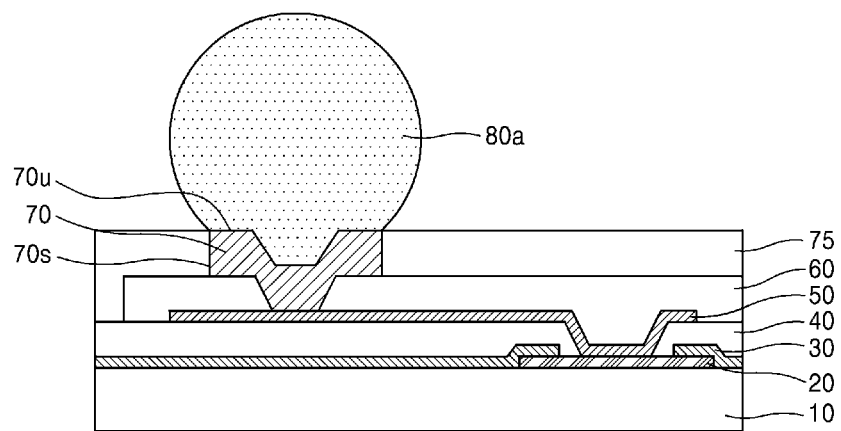
FIG. 2 is a cross-sectional view of describing one of the steps of a method of manufacturing a semiconductor package, according to a comparative example of the present invention.

A comparative example of the present invention to be compared to the configuration of FIG. 1 is illustrated in FIG. 2.

Referring to FIG. 2, before a reflow process is performed on the primary solder ball 80a, an additional passivation pattern 75 is formed not to expose the side wall 70s of the UBM structure 70. The additional passivation pattern 75 may prevent oxidation of the side wall 70s of the UBM structure 70 in a reflow process. However, since additional deposition and photolithography processes are required to form the passivation pattern 75, manufacturing costs are increased.

FIG. 7 is a graph showing a temperature profile of the reflow process used in the method of manufacturing a semiconductor package, according to an embodiment of the present invention.

Referring to FIG. 7, a temperature (unit: ° C.) profile of the reflow process based on time (unit: sec.) is shown. In the graph, 'step1' corresponds to the step of FIG. 1, 'step2' corresponds to the step of FIG. 3, 'step3' corresponds to the step of FIG. 4, and 'step5' corresponds to the step of FIG. 5. In the method of manufacturing a semiconductor package, according to an embodiment of the present invention, the primary solder ball 80a may be formed to expose the side wall 70s of the UBM structure 70 in 'step1' before the temperature is increased for the reflow process. As such, oxidation of the UBM structure 70 may be effectively prevented without forming the additional passivation pattern 75 as illustrated in FIG. 2.

The above-described configuration may be easily implemented when the UBM structure 70 has a thickness equal to or greater than a certain thickness. The thickness of the UBM structure 70 may be greater than a thickness (e.g., about 8 μm) of an intermetallic compound formed at an interface of the UBM structure 70 and the solder ball. In this case, the thickness of the UBM structure 70 may be 20 μm to 50 μm. For example, when the thickness of the UBM structure 70 is 30 μm, the antioxidant layer may be effectively formed.

While the present invention has been particularly shown and described with reference to embodiments thereof, it will be understood by one of ordinary skill in the art that various changes in form and details may be made therein without departing from the scope of the present invention as defined by the following claims.

The invention claimed is:

1. A method of manufacturing a semiconductor package, the method comprising:

a first step, for forming a primary solder ball having a ball shape on an under bump metallurgy (UBM) structure on a substrate with a lower surface of the UBM facing the substrate; and a second step, for forming a secondary solder ball on an upper surface of the UBM structure by performing a reflow process on the primary solder ball while a side wall of the UBM structure is exposed.

2. The method of claim 1, wherein, in the first step, a thickness of the UBM structure is greater than a thickness of an intermetallic compound formed at an interface of the solder ball and the UBM structure.

3. The method of claim 1, wherein the second step comprises a step for melting the primary solder ball to cover the side wall of the UBM structure and then cooling and contracting the primary solder ball to form an antioxidant layer on the side wall of the UBM structure and form the secondary solder ball on the upper surface of the UBM structure.

4. The method of claim 1, wherein the second step comprises a step for melting the primary solder ball to cover the side wall of the UBM structure and then cooling and contracting the primary solder ball to form an antioxidant layer on the side wall of the UBM structure and form the secondary solder ball not on the side wall of the UBM structure but on only the upper surface of the UBM structure.

5. The method of claim 3, wherein the antioxidant layer comprises a tin (Sn) component of the solder ball, and
wherein the UBM structure is configured as a copper (Cu) layer.

6. The method of claim 3, wherein the antioxidant layer comprises a tin (Sn) component of the solder ball, and
wherein the UBM structure comprises a structure in which a copper (Cu) layer, a nickel (Ni) layer, and a gold (Au) layer are sequentially stacked on one another, or a structure in which a Cu layer and a Ni layer are sequentially stacked on one another.

7. The method of claim 4, wherein the antioxidant layer comprises a tin (Sn) component of the solder ball, and
wherein the UBM structure is configured as a copper (Cu) layer.

8. The method of claim 4, wherein the antioxidant layer comprises a tin (Sn) component of the solder ball, and
wherein the UBM structure comprises a structure in which a copper (Cu) layer, a nickel (Ni) layer, and a gold (Au) layer are sequentially stacked on one another, or a structure in which a Cu layer and a Ni layer are sequentially stacked on one another.

\* \* \* \* \*